United States Patent [19]

Dierschke

[11] 4,279,690

[45] Jul. 21, 1981

[54] HIGH-RADIANCE EMITTERS WITH INTEGRAL MICROLENS

[75] Inventor: Eugene G. Dierschke, Dallas, Tex.

[73] Assignee: Texas Instruments Incorporated, Dallas, Tex.

[21] Appl. No.: 834,211

[22] Filed: Sep. 19, 1977

Related U.S. Application Data

[62] Division of Ser. No. 626,406, Oct. 28, 1975, abandoned.

[51] Int. Cl.³ .......................................... H01L 21/306
[52] U.S. Cl. .................................... 156/649; 156/648; 156/654; 156/656; 156/662; 427/77; 357/17; 313/498; 313/499; 313/110
[58] Field of Search ....................... 313/498, 499, 110; 357/17; 156/662, 654, 656, 648, 649; 427/77

[56] References Cited

U.S. PATENT DOCUMENTS

| | | | |
|---|---|---|---|
| 3,443,140 | 5/1969 | Ing | 317/17 |
| 3,512,027 | 5/1970 | Kupsky | 317/17 |
| 3,703,670 | 11/1972 | Kunz | 317/17 |
| 3,767,493 | 10/1973 | Kump | 156/654 |
| 3,877,052 | 4/1975 | Dixon | 357/17 |
| 3,954,534 | 5/1976 | Scifres | 427/85 |

Primary Examiner—Ronald H. Smith
Assistant Examiner—Richard Bueker
Attorney, Agent, or Firm—Gary Honeycutt; Rich Donaldson; Mel Sharp

[57] ABSTRACT

This invention deals with the fabrication of radiation emitting diodes having a small diameter shaped integral microlens formed by etching. Initially an oxide layer is deposited on the backside of the processed slice; then a ring pattern is opened in the oxide. An etch is used to form a ring groove with a mesa in the center. The center oxide dot over the mesa is removed and the etching continued to round off the edges of the mesa and to form a smooth shaped structure. Various shapes and diameters may be achieved with different ring dimensions and with different etch times.

4 Claims, 5 Drawing Figures

HIGH-RADIANCE EMITTERS WITH INTEGRAL MICROLENS

This is a division of application Ser. No. 626,406, filed Oct. 28, 1975, now abandoned.

FIELD OF THE INVENTION

This invention relates to radiation emitting diodes and more particular small-area high-radiance emitters with integral microlens.

BACKGROUND OF THE INVENTION

Two principal factors which limit the efficiency of infrared emitting diodes are the absorption of the generative radiation of the semiconductor material before emission and, the total internal reflection at the semiconductor-air interface. In GaAs flat devices, the absorption can be minimized by the use of thin transparent layers of high bandgap energy GaAlAs. The high refractive index of GaAs ($n_s = 3.6$) compared to that of air ($n_a = 1.0$) results in a large refraction of rays at the semiconductor-air interface for rays which are not normal to the interface. Total internal reflection of rays occurs for angles greater than the critical angle $(\theta_s)_c$ defined by $\sin (\theta_s)_c = n_a/n_s$. Thus, only rays within a cone with a half angle of 16.1 degrees can be emitted through the top of the flat emitter. This corresponds to 2 percent of the total generated radiation, assuming no rays are reflected from the backside of the emitter. Shaped emitters can be used to eliminate total internal reflections. For a hemispherical emitter with a small junction diameter, all rays are incident approximately normal to the semiconductor-air interface and total internal reflection losses are eliminated. Ideally, a factor of 13 increase in radiant intensity (W/sr) can be achieved by use of a hemispherical emitter instead of a flat emitter. A disadvantage of the normal GaAs 18 mil diameter homostructure hemispherical emitter is that the increased path length leads to increased absorption and thus the lower values of radiance. GaAlAs 18-mil diameter hemispherical emitters with graded AlAs composition to reduce absorption have been fabricated in the past. However, very thick GaAlAs epitaxial layers are required (9-10 mils). A technique for the growth of very thick GaAlAs epitaxial layers has been developed but the technique is not reproducible and is not compatible with multi-layer double heterostructure junctions which have high radiances.

One approach to eliminate the requirement for thick transparent GaAlAs epitaxial layers is to greatly reduce the diameter of the hemisphere. To do this directly is not practical because of the difficulty of handling emitters with diameters less than 10-15 mils in diameter and because of a need of a minimum spacing between the N and P contacts on the base of the hemisphere to prevent formation of shorts during solder mounting of the devices on silicon submounts.

A more practical approach for achieving smaller diameter shaped emitting surfaces is to use an etching process to form an integral lens in a larger size device chip. The process for forming the shaped emitting surface is part of the new invention.

A previous approach for an integral lens structure has been described in the article "Integral Lens Coupled LED" by F. D. King and A. J. Springthorp, published in Electronic Materials Number 4, Page 243, 1975. The approach was to etch an array of small hemispherical holes in the GaAs substrate before growth of a multilayer GaAlAs structure. The epitaxial growth fills in the etched holes. During device processing, a preferential etch (etches GaAs but not GaAlAs) was used to remove localized regions of the GaAs substrate from the backside of the slice and to leave a GaAlAs microlens structure. However, only a slight increase in optical output power and device performance was achieved. The limitation of this approach is that the hemispherical lenses are small compared to the junction size, because of the difficulty of filling in very deep holes by liquid phase epitaxial techniques. For optimum improvement with a hemispherical shape, the junction should be small compared to the lens size. This can be accomplished by the process described in this invention.

SUMMARY OF THE INVENTION

In order to provide an efficient, high radiance device which may be coupled to an optical fiber, an emitting diode is formed which has a lens integral therewith for increasing the total emitted radiation and for focusing the emitted radiation at the end of the fiber. The lens is relatively large compared to the emitting junction and it is slightly recessed in the semiconductor wafer. The lens is formed using an oxide mask and etching the semiconductor wafer. Etching is accomplished to two stages wherein a mask with a circular opening is used. The center portion of the circle is also mask so that a mesa type structure is formed. Then the central covering is removed to shape the mesa to form the lens.

The emitting device may be further enhanced by plating around the lens to form a reflecting surface.

Accordingly it is an object and feature of the present invention to provide an improved emitting device by increasing its efficiency and reducing the absorption of the regenerated radiation within the semiconductor material. The inventive features and the technical advance of the invention may be more clearly understood from the detailed description which follows and the drawings in which.

DESCRIPTION OF THE INVENTION

Figure 1:
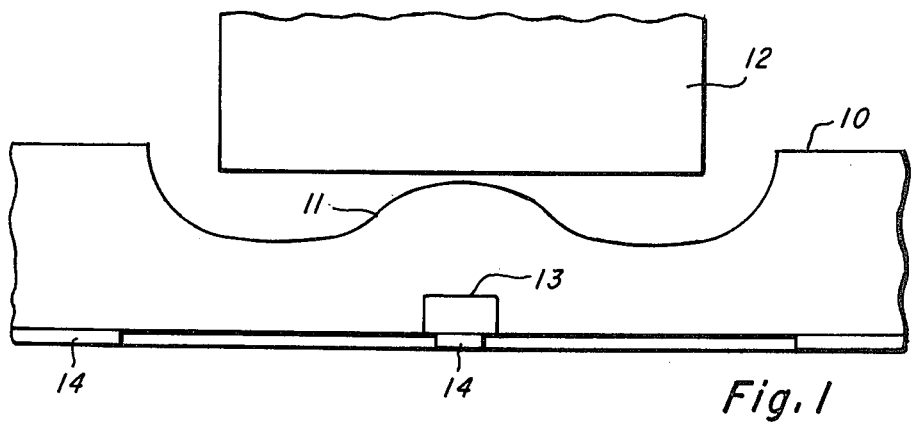
FIG. 1 is an illustration of an emitting device with a lens formed by the present invention coupled to a fiber optic.

Illustrated in FIG. 1 is an emitter having an integral lens coupled to a fiber optic. The emitter is fabricated from a semiconductor material 10 in which a P-N junction 13 has been formed, at which radiation is generated when the device is operated at forward currents. The P-N junction may be formed by diffusing directly into a GaAs substrate or by growing one or more layers of GaAs and/or GaAlAs on the substrate and then diffusing into one or more layers to form a buried junction emitter device as described in copending application Ser. No. 618,978 filed Oct. 2, 1975, now U.S. Pat. No. 4,037,241. The radiation from the emitting junction is collected and radiated through a lens 11, which is made from a portion of the semiconductor material 10. This optical radiation is then picked up by the optical fiber 12 and transmitted elsewhere. Contacts 14 which interconnect with the semiconductor material and the junction region 13 are formed on the opposite side of the device from which radiation is emitted.

A process for making the lens integral with the emitter structure is described as follows with reference to FIGS. 2a and 2b of the drawings. Initially an oxide layer 21 is deposited on the backside of a processed slice. This processed slice will already have constructed thereon many emitting devices. The PN junctions 24 in the emitting devices may be made by diffusing directly into a GaAs substrate or by growing one or more layers of material on the substrate and then diffusing into one or more layers to form a buried junction structure.

A ring pattern 22 is opened in the oxide and an isotropic etch is used to form a ring groove 23 with a mesa 27 in the center. The center oxide over the mesa is then removed and etching is continued as illustrated in FIG. 2b until the top portion of the mesa is rounded off and a smooth shaped microlens structure 25 is obtained. Various shapes and diameters of the lens structure may be achieved with different ring dimensions and different etch times.

The method described above is suitable for providing a lens structure which is large compared with the emitting junction size. Maximum efficiency can be maintained for such a structure as long as the hemisphere diameter is at least 3.6 times the junction diameter. For a 2-mil diameter junction the minimum hemisphere diameter would have to be 7.2 mils.

Figure 2A:
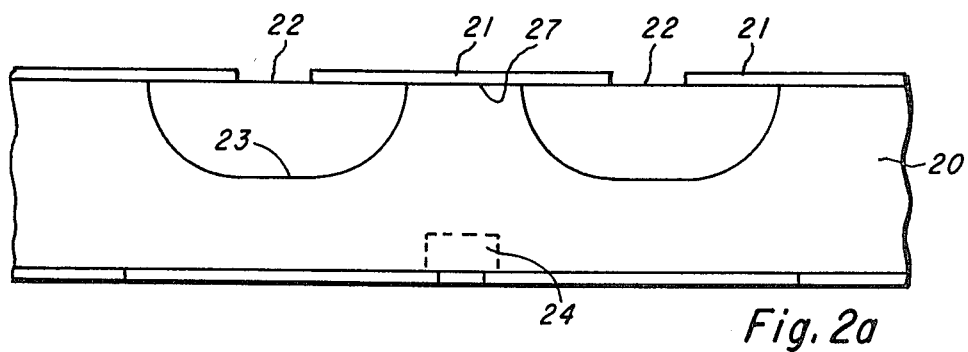
FIG. 2a and 2b illustrate the basic etching steps in forming the microlens.
Figure 2B:
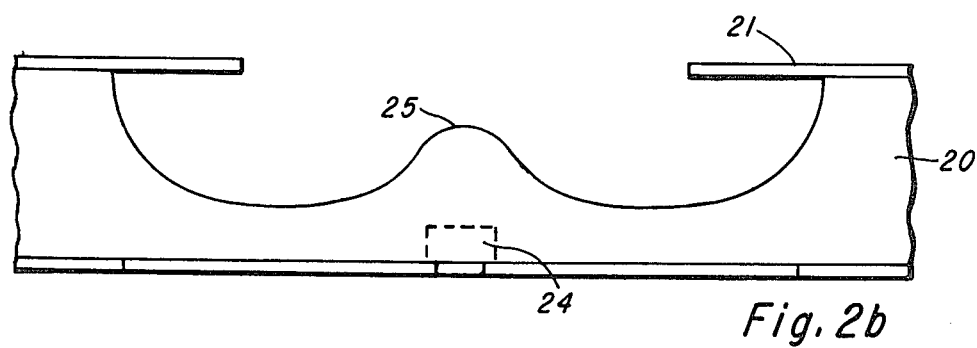
Figure 3A:
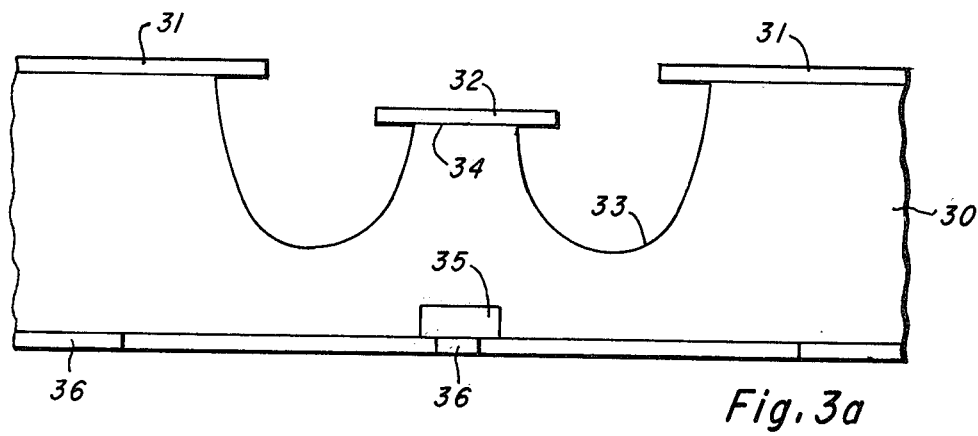
FIGS. 3a through 3c illustrate additional processing steps in forming a microlens and reflector surface.
Figure 3B:
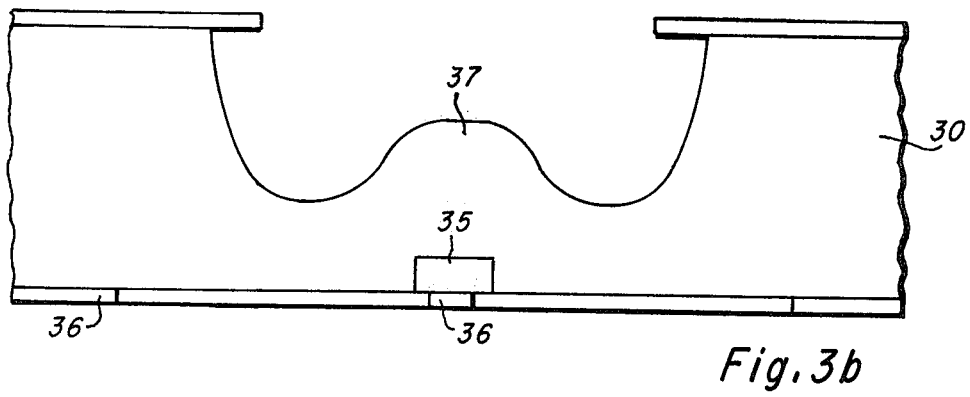
Figure 3C:
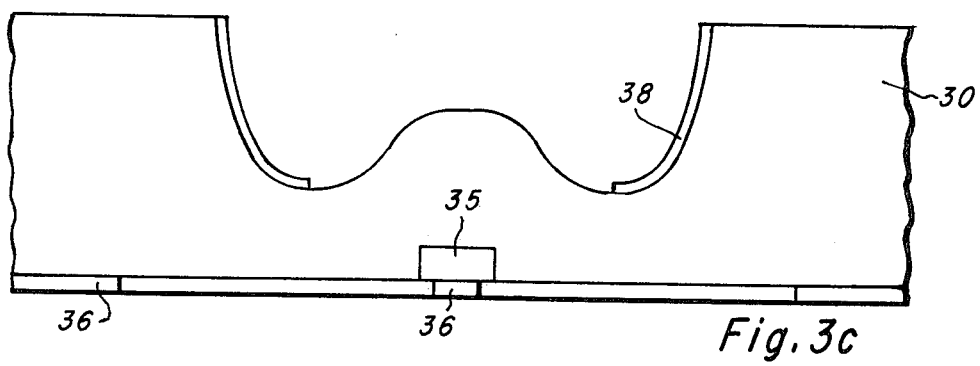

In FIGS. 3a through 3c, the basic concept illustrated in FIGS. 2a and 2b is extended to the fabrication of an integral lens with the addition of a reflector. In FIG. 3a is illustrated a semiconductor slice 30 in which a PN junction 35 and ohmic contacts 36 have been formed. A hole has initially been etched in the semiconductor slice through a circular opening in the oxide 31. Then a circular dot of oxide 32 is added and additional etching is performed to form a ring grove 33 with a mesa 34 in the center. Thereafter, the center oxide dot 32 over the top of the mesa is removed and etching is continued to form the smooth shaped microlens 37. Upon completion of the microlens a metallic deposition 38 may be made which covers the walls of the etch recess with the exception of the microlens, as illustrated in FIG. 3c. The metallic coating may be any highly reflective metal. However, it has been found that gold forms an excellent reflector since it does not oxidize and retains its reflective surface.

Even though specific embodiments have been disclosed and described, it is to be understood that various modifications, changes and alterations may be made without departing from the spirit and scope of the invention as defined by the appended claims.

What is claimed is:

1. A process for making a radiation emitting semiconductor device comprising the steps of depositing an oxide on one side of an emitting device structure having an emitting junction, selectively removing an annular region of the oxide, selectively etching the exposed annular portion of the device structure to form a mesa type structure, selectively removing the oxide over the mesa structure and then selectively etching further to round the top of the mesa structure.

2. The process according to claim 1 wherein the mesa structure is formed over the emitting junction.

3. The process according to claim 1 wherein the rounded mesa structure forms a lens.

4. The process according to claim 1 wherein a reflective material is deposited around the rounded mesa structure.

* * * * *